United States Patent
Yao et al.

(10) Patent No.: US 6,764,927 B1
(45) Date of Patent: Jul. 20, 2004

(54) CHEMICAL VAPOR DEPOSITION (CVD) METHOD EMPLOYING WETTING PRE-TREATMENT

(75) Inventors: Liang-Gi Yao, Hsing-Chu (TW); Ming-Fang Wang, Taichung (TW); Yeou-Ming Lin, Jungli (TW); Tuo-Hung Ho, Chia-Yi (TW); Shih-Chang Chen, Taoyuan (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 10/423,083

(22) Filed: Apr. 24, 2003

(51) Int. Cl.[7] .......................... H01L 21/20; H01L 21/36; H01L 21/336
(52) U.S. Cl. .................... 438/478; 438/287; 438/584
(58) Field of Search .................. 438/287, 459, 438/584, 478, 33, 142, 614, 619, 714, 734, 510, 688

(56) References Cited

U.S. PATENT DOCUMENTS

| | | | | |
|---|---|---|---|---|
| 4,915,772 A | * | 4/1990 | Fehlner et al. | 257/E21.134 |
| 5,480,835 A | * | 1/1996 | Carney et al. | 438/614 |
| 5,622,305 A | * | 4/1997 | Bacon et al. | 257/E23.008 |
| 5,639,325 A | * | 6/1997 | Stevens et al. | 257/634 |
| 5,885,837 A | * | 3/1999 | Winkler et al. | 435/91.1 |
| 5,942,799 A | * | 8/1999 | Danek et al. | 257/751 |
| 6,080,529 A | * | 6/2000 | Ye et al. | 257/E21.027 |
| 6,261,942 B1 | * | 7/2001 | Zhou et al. | 438/619 |
| 6,280,584 B1 | * | 8/2001 | Kumar et al. | 427/569 |
| 6,287,897 B1 | * | 9/2001 | Gousev et al. | 438/142 |
| 6,297,539 B1 | * | 10/2001 | Ma et al. | 257/410 |
| 6,303,480 B1 | * | 10/2001 | Desai et al. | 438/584 |
| 6,319,797 B1 | * | 11/2001 | Usami | 438/510 |
| 6,379,985 B1 | * | 4/2002 | Cervantes et al. | 438/33 |
| 6,440,870 B1 | * | 8/2002 | Nallan et al. | 438/734 |
| 6,455,427 B1 | * | 9/2002 | Lau | 438/688 |
| 6,489,247 B1 | * | 12/2002 | Ye et al. | 438/714 |
| 6,500,733 B1 | * | 12/2002 | Stanbery | 438/459 |
| 6,559,372 B2 | * | 5/2003 | Stanbery | 257/184 |
| 6,579,806 B2 | * | 6/2003 | Nallan et al. | 438/720 |
| 6,593,213 B2 | * | 7/2003 | Stanbery | 438/478 |

* cited by examiner

Primary Examiner—John F. Niebling
Assistant Examiner—Walter Lee Lindsay, Jr.
(74) Attorney, Agent, or Firm—Tung & Associates

(57) ABSTRACT

A chemical vapor deposition (CVD) method for forming a microelectronic layer within a microelectronic product employs a wetting material treatment of a substrate upon which is formed the microelectronic layer. The wetting material treatment provides for an attenuated incubation or induction time when forming the microelectronic layer, particularly within the context of a digital CVD method, such as an atomic layer CVD method. The microelectronic layer is thus formed with enhanced manufacturability.

20 Claims, 3 Drawing Sheets

CHEMICAL VAPOR DEPOSITION (CVD) METHOD EMPLOYING WETTING PRE-TREATMENT

BACKGROUND OF THE INVENTION

1. Field of the Invention

The present invention relates generally to methods for fabricating microelectronic products. More particularly, the present invention relates to chemical vapor deposition (CVD) methods for fabricating microelectronic products.

2. Description of the Related Art

Common in the microelectronic product fabrication art is the use of chemical vapor deposition (CVD) methods for forming microelectronic layers. CVD methods are desirable in the microelectronic product fabrication art insofar as CVD methods are generally readily adaptable for forming microelectronic layers of various microelectronic materials.

As microelectronic fabrication methodology has evolved CVD methods have also evolved to include a sub-class known as digital CVD methods. Digital CVD methods employ a sequential and separate pulsing of reactant materials, rather than a co-deposition of reactant materials, so that microelectronic material layers may be formed with enhanced compositional and dimensional control. Included among digital CVD methods are atomic layer chemical vapor deposition (ALCVD) methods where a pulsing is intended to form or react a single atomic layer of reactant material.

While digital CVD methods, such as ALCVD methods, are thus desirable and often essential in the microelectronic product fabrication art, digital CVD methods, and in particular ALCVD methods, are nonetheless not entirely without problems. In that regard, ALCVD methods are not always optimally manufacturable insofar as ALCVD methods require precise control of timing of introduction of multiple reactant materials into a CVD reactor chamber.

It is thus desirable in the microelectronic product fabrication art to provide ALCVD methods with enhanced manufacturability.

It is towards the foregoing object that the present invention is directed.

Various microelectronic products, and CVD methods for fabrication thereof, have been disclosed in the microelectronic product fabrication art.

Included but not limiting among the microelectronic products and CVD methods are those disclosed within: (1) Gousev et al., in U.S. Pat. No. 6,287,897 (a high dielectric constant gate dielectric layer with self forming barrier layer as may be formed employing an ALCVD method and employed within a field effect transistor (FET) device); and (2) Ma et al., in U.S. Pat. No. 6,297,539 (another high dielectric constant gate dielectric layer as may be formed employing an ALCVD method and employed within an FET device).

The teachings of each of the foregoing references are incorporated herein fully by reference.

Desirable in the microelectronic product fabrication art are additional ALCVD methods with enhanced manufacturability.

It is towards the foregoing object that the present invention is directed.

SUMMARY OF THE INVENTION

A first object of the invention is to provide an ALCVD method for forming a microelectronic layer.

A second object of the invention is to provide am ALCVD method in accord with the first object of the invention, wherein the microelectronic layer is formed with enhanced manufacturability.

In accord with the objects of the invention, the invention provides a CVD method for forming a microelectronic layer.

To practice the method of the invention, there is first provided a substrate. There is then treated the substrate with a wetting material to provide a wettable substrate. There is then formed upon the wettable substrate a first reactant material layer. Finally, there is then treated the first reactant material layer with a second reactant material to form a reacted material layer.

The present invention provides a CVD method for forming a microelectronic layer, wherein the microelectronic layer is formed with enhanced manufacturability.

The present invention realizes the foregoing object by incorporating within the CVD method a wetting material treatment of a substrate to form a wettable substrate prior to forming upon the wettable substrate a microelectronic layer while employing the CVD method. By employing the wetting material treatment, the microelectronic layer is formed with enhanced manufacturability insofar as there is attenuated or avoided a variable incubation or induction time for sorption of a reactant material upon the substrate.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a CVD method for forming a microelectronic layer, wherein the microelectronic layer is formed with enhanced manufacturability.

The present invention realizes the foregoing object by incorporating within the CVD method a wetting material treatment of a substrate to form a wettable substrate prior to forming upon the wettable substrate a microelectronic layer while employing the CVD method. By employing the wetting material treatment, the microelectronic layer is formed with enhanced manufacturability insofar as there is attenuated or avoided a variable incubation or induction time for sorption of a reactant material upon the substrate.

Although the present invention provides particular value within the context of forming a gate dielectric layer upon a silicon semiconductor substrate while employing an ALCVD method, the invention is not intended to be so limited. Rather, the invention may be employed for forming microelectronic layers including but not limited to conductor layers, semiconductor layers and dielectric layers while employing CVD methods of various varieties, but more particularly digital CVD methods and ALCVD methods. In particular, dielectric layers formed in accord with the invention may be employed as gate dielectric layers within field effect devices, as well as capacitive dielectric layers within capacitive devices.

FIG. 1 to FIG. 4 show a series of schematic cross-sectional diagrams illustrating the results of progressive stages of fabricating a microelectronic product in accord with a preferred embodiment of the invention.

Figure 1:
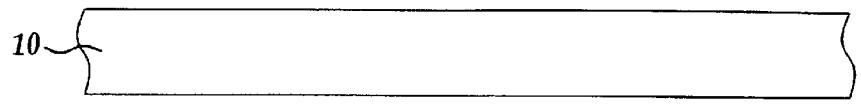
FIG. 1, FIG. 2, FIG. 3 and FIG. 4 show a series of schematic cross-sectional diagrams illustrating the results of progressive stages in fabricating a microelectronic product in accord with the invention.

FIG. 1 illustrates a schematic cross-sectional diagram of the microelectronic product at an early stage in its fabrication in accord with the invention.

FIG. 1 illustrates a substrate 10.

Within the invention, the substrate 10 may be employed within a microelectronic product selected from the group including but not limited to integrated circuit products (including semiconductor products), ceramic substrate products and optoelectronic products.

Although not specifically illustrated within the schematic diagram of FIG. 1, the substrate 10 may consist of a substrate alone as employed within the microelectronic product. In the alternative, the substrate 10 may comprise the substrate as employed within the microelectronic product, where the substrate has formed thereupon and/or thereover any of several additional microelectronic layers as are conventionally employed within the microelectronic product within which is employed the substrate 10. Analogously with the substrate alone, such additional microelectronic layers may be formed of microelectronic materials selected from the group including but not limited to conductor materials, semiconductor materials and dielectric materials.

Preferably, the substrate 10 consists of a silicon semiconductor substrate which has first been chemically cleaned employing conventional or unconventional cleaning methods and compositions. Exemplary conventional cleaning compositions may include, but are not limited to hydrofluoric acid, ammonium hydroxide, hydrochloric acid and hydrogen peroxide cleaning compositions, as well as mixtures thereof. In addition, the chemically cleaned silicon semiconductor substrate may also be additionally treated with a nitriding treatment, such as a thermal nitriding treatment or a plasma nitriding treatment, such as to provide a hydrogen and/or nitrogen passivated silicon semiconductor substrate which provides a semiconductor substrate upon which may be formed an FET device. Such a semiconductor substrate is passivated with hydrogen and/or nitrogen functionality to provide the silicon semiconductor substrate with a vapor moisture coverage of from about 30 to about 100 percent.

Figure 2:
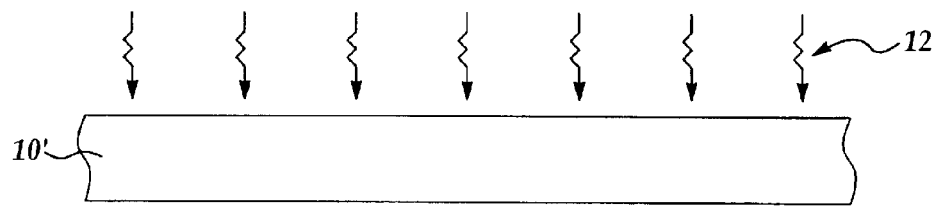

FIG. 2, illustrates the results of further processing of the microelectronic product of FIG. 1.

FIG. 2 illustrates the results of treating the substrate 10 with a wetting material treatment 12 to form therefrom a wettable substrate 10'.

Within the invention, the wetting material treatment 12 may employ any of several wetting materials, including in particular moisture or moisture vapor wetting materials, but also including alcohol or alcohol vapor wetting materials. Preferably, the wetting material treatment 12 is provided in-situ within a CVD reactor chamber. Preferably, the wetting material treatment 12 is provided as a successive series of purge cycles wherein water vapor is introduced into the CVD reactor chamber at an elevated pressure and purged from the reactor chamber incident pumping the reactor chamber to a lower pressure. Preferably, the moisture is introduced into the CVD reactor chamber at a temperature of about 15 to about 50 degrees centigrade and a pressure of from about $10^{-2}$ to about 100 torr, and pumped from the reactor chamber at a pressure of about 0.1 to about 1000 mtorr. The substrate temperature in the reactor ranges from 200 to 500 degrees centigrade. Typically, the present invention provides for a minimum of one moisture purge cycle as the wetting material treatment 12, more preferably at least two and most preferably from about 2 to about 5 moisture purge cycles as the wetting material treatment 12.

Incident to such wetting material treatment 12, the wettable substrate 10' will typically have a vapor moisture coverage of from about 30 to about 100 percent. Typically, the wettable substrate 10' will have a surface hydroxyl functionality of at least about 30 percent, and more preferably of at least about 75 percent, of that which may be achieved with a corresponding fully wettable substrate. An exemplary fully wettable substrate may for example be a fully oxidized and subsequently fully hydrated substrate. Comparative measurements of hydroxyl functionality may be obtained employing spectroscopic methods (such as photoelectron spectroscopic methods and infrared spectroscopic methods) as are conventional in the microelectronic product fabrication art and as are illustrated in further detail within the examples which follow.

Figure 3:
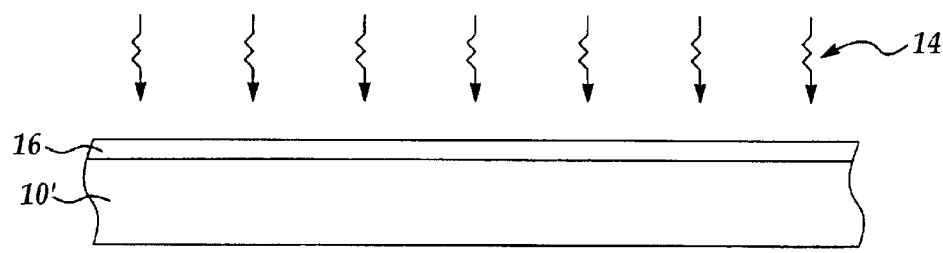

FIG. 3 shows the results of further processing of the microelectronic product of FIG. 2.

FIG. 3 shows the results of forming upon the wettable substrate 10' a first reactant material layer 16 formed from CVD reaction of a first reactant material 14.

Within the invention, the first reactant material layer 16 may be formed from any of several reactant materials, including but not limited to metal chloride reactant materials and metal alkoxide reactant materials. Typically the first reactant material 14 employs a precursor material from which is formed a generally higher dielectric constant gate dielectric layer within an FET device, under circumstances where the substrate 10 is a silicon semiconductor substrate. Such higher dielectric constant dielectric materials are disclosed in greater detail within the references cited within the Description of the Related Art, the teachings of all of which related are incorporated herein fully by reference. Representative materials include oxides and silicates of tantalum, aluminum, titanium, zirconium, yttrium, lanthanum, hafnium and mixtures thereof. Preferably, the first reactant material layer 16 is formed of a thickness of from about 0.3 to about 2 angstroms, preferably as a monolayer.

Within the present invention, by employing the wetting material treatment 12 to form the wettable substrate 10' from the substrate 10, the first reactant material layer 16 is formed with enhanced speed and uniformity with a reduced incubation period or a reduced induction period, due to the enhanced wettability of the wettable substrate 10'. Thus, the first reactant material layer 16 is formed with enhanced manufacturability, particularly under circumstances where the first reactant material layer 16 is formed employing an ALCVD method where control of monolayer thickness is significant.

Figure 4:
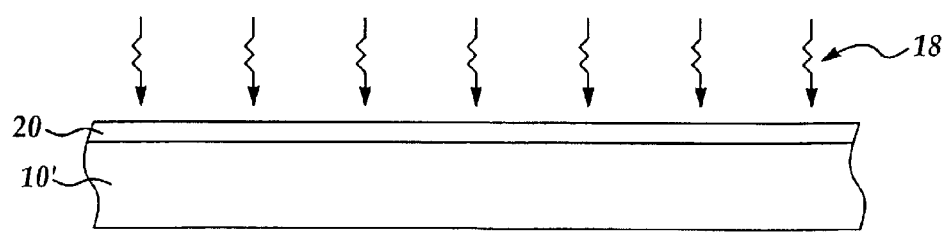

FIG. 4 shows the results of further processing of the microelectronic product of FIG. 3.

FIG. 4 shows the results of treating the first reactant material layer 16 with a second reactant material 18 to form therefrom a reacted material layer 20.

Within the invention, the second reactant material 18 is selected within the context of the reacted material desired to be formed from the first reactant material layer 16. Typically, the second reactant material treatment 18 employs an oxidizing second reactant material, such as but not limited to oxygen, which forms an oxide layer, such as a gate dielectric layer, from the first reactant material layer 16.

As is understood by a person skilled in the art, the present invention contemplates additional sequential first reactant material 14 treatments and second reactant material 18 treatments such as to provide a reacted material layer 20 of desired thickness, generally in a range of from about 10 to about 150 angstroms.

FIG. 4 shows a schematic cross-sectional diagram of a microelectronic product formed in accord with a preferred embodiment of the invention. The microelectronic product has formed therein a microelectronic layer formed employing a CVD method, with enhanced manufacturability. The method realizes the foregoing result by treating a substrate upon which is formed the microelectronic layer with a wetting material treatment prior to forming thereupon the microelectronic layer while employing the CVD method, which is preferably a digital CVD method, such as an ALCVD method.

EXAMPLES

Figure 5:
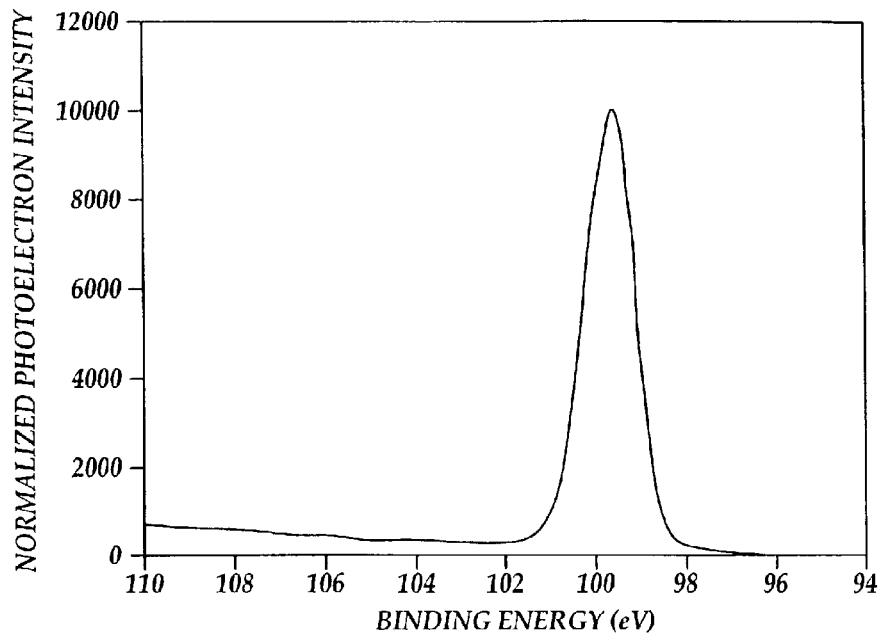
FIG. 5, FIG. 6 and FIG. 7 show a series of photoelectron spectra for a series of silicon semiconductor substrates which are surface treated employing various methods.
Figure 6:
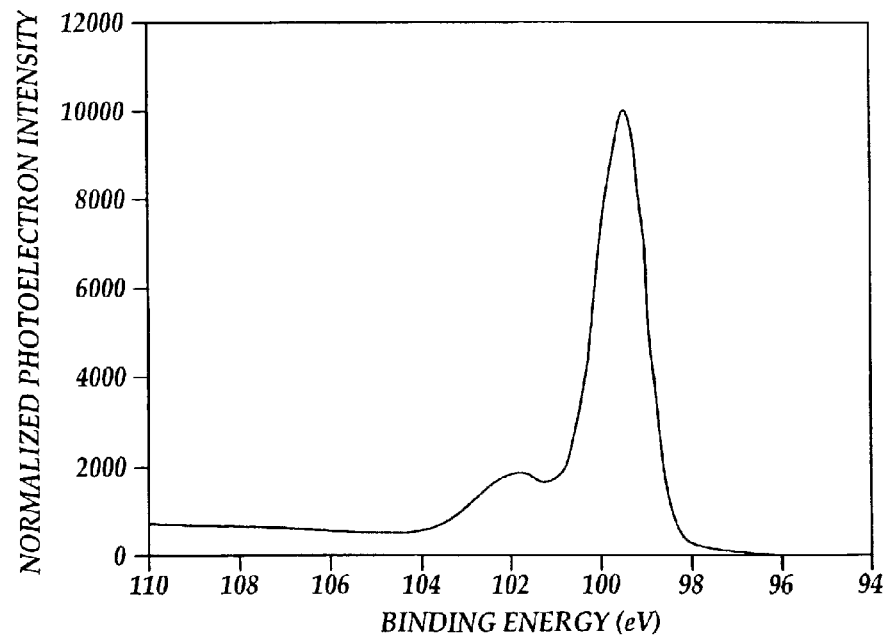
Figure 7:
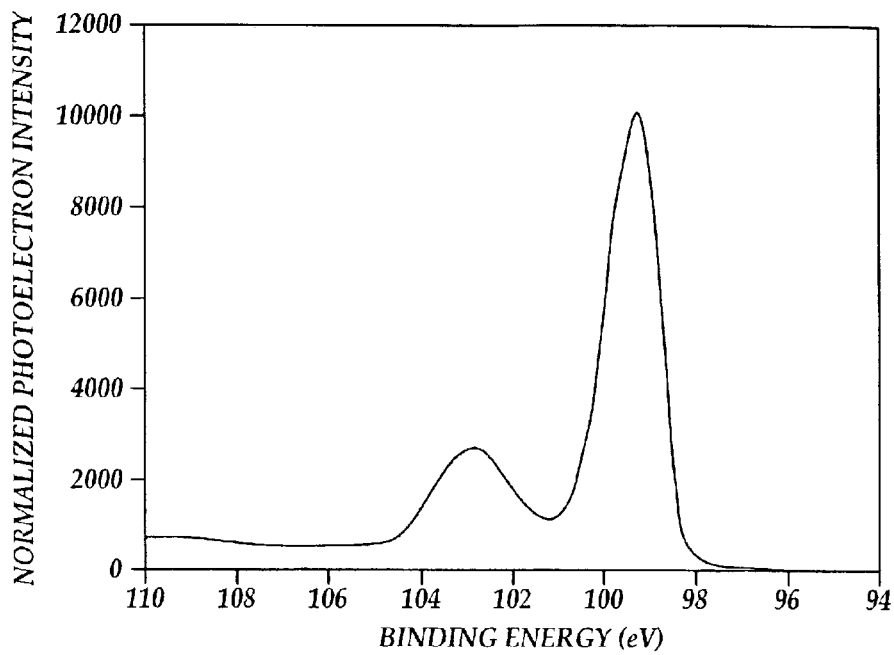

FIG. 5 to FIG. 7 show a series of photoelectron spectra for a series of silicon semiconductor substrates surface treated employing various methods.

FIG. 5 shows a photoelectron spectrum of a silicon semiconductor substrate treated via immersion within a 2 percent aqueous hydrofluoric acid solution for 30 seconds to form a hydrogenated silicon semiconductor substrate surface.

FIG. 6 show a photoelectron spectrum of a silicon semiconductor substrate treated in accord with the silicon semiconductor substrate whose photoelectron spectrum is illustrated in FIG. 5, but having an additional ammonia nitriding vapor treatment at 560 degrees centigrade for one minute to thus form a nitrided silicon semiconductor substrate surface.

FIG. 7 shows a photoelectron spectrum of a silicon semiconductor substrate treated via immersion within a generally conventional aqueous hydrophilic cleaning solution to form a hydrophilic hydroxylated silicon semiconductor substrate surface.

Within each of FIG. 5, FIG. 6 and FIG. 7, the peak at about 99 electron volts binding energy corresponds with a silicon substrate bonding. Within FIG. 6, the minor peak at about 102 electron volts binding energy corresponds with silicon nitride or silicon oxynitride bonding. Within FIG. 7, the minor peak at about 103 electron volts corresponds with silicon hydroxide bonding. As is seen from review of the graphs of FIG. 5, FIG. 6 and FIG. 7, silicon hydroxide functionality may be monitored relative to a base silicon substrate base peak to provide means for quantifying silicon surface hydroxyl functionality in accord with the invention.

Figure 8:
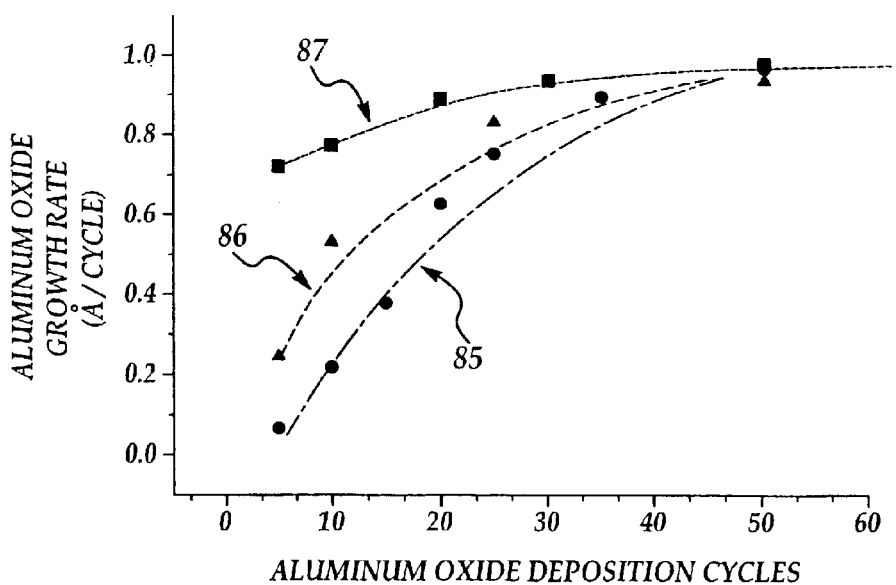
FIG. 8 shows a graph of Aluminum Oxide Growth Rate versus Aluminum Oxide Deposition Cycles for forming an aluminum oxide layer upon the series of silicon semiconductor substrates whose photoelectron spectra are illustrated in FIG. 5 to FIG. 7.

FIG. 8 shows a plot of Aluminum Oxide Growth Rate versus Aluminum Oxide Deposition Cycles for an aluminum oxide layer formed employing an ALCVD method upon each of the three silicon semiconductor substrates whose photoelectron spectra are illustrated in FIG. 5, FIG. 6 and FIG. 7.

Within FIG. 8, the data points which correspond with reference numeral 85 correspond with deposition rates for forming the aluminum oxide layer upon the hydrogenated silicon substrate whose photoelectron spectrum is illustrated in FIG. 5. In addition, the data points which correspond with reference numeral 86 correspond with deposition rates for forming the aluminum oxide layer upon the nitrided silicon substrate whose photoelectron spectrum is illustrated in FIG. 6. Finally, the data points which correspond with reference numeral 87 correspond with deposition rates for forming the aluminum oxide layer upon the hydrophilic hydroxylated silicon substrate whose photoelectron spectrum is illustrated in FIG. 7.

As is illustrated in FIG. 8, a substantial incubation or induction time exists for forming an aluminum oxide layer upon either a hydrogenated silicon substrate surface or a nitrided silicon substrate surface, but not a hydrophilic hydroxylated silicon substrate surface as may be formed in accord with the invention.

As is understood by a person skilled in the art, the preferred embodiment of the invention is illustrative of the invention rather than limiting of the invention. Revisions and modifications may be made to methods, materials, structures and dimensions employed when fabricating a microelectronic product in accord with the preferred embodiment of the invention, while still fabricating a microelectronic product in accord with the invention, further in accord with the accompanying claims.

What is claimed is:

1. A chemical vapor deposition method for forming a microelectronic layer comprising:

providing a substrate;

treating the substrate with a wetting material to provide a wettable substrate;

forming upon the wettable substrate a first reactant material layer; and treating the first reactant material layer with a second reactant material to form a reacted material layer.

2. The method of claim 1 wherein the substrate is employed within a microelectronic product selected from the group consisting of integrated circuit products, ceramic substrate products and optoelectronic products.

3. The method of claim 1 wherein the wetting material is moisture.

4. The method of claim 1 wherein the wetting material is an alcohol.

5. The method of claim 1 wherein the substrate is treated with the wetting material through use of a minimum of one purge cycle within a reactor chamber within which is formed the reacted material layer upon the wettable substrate.

6. The method of claim 1 wherein the substrate is treated with the wetting material through use of a minimum of two purge cycles within a reactor chamber within which is formed the reacted material layer upon the wettable substrate.

7. The method of claim 1 wherein the reacted material layer is selected from the group consisting of conductor layers, semiconductor layers and dielectric layers.

8. A chemical vapor deposition method for forming a microelectronic layer comprising:

providing a substrate;

treating the substrate with a wetting material to provide a wettable substrate having a minimum of 60 percent surface hydroxyl functionality;

forming upon the wettable substrate a first reactant material layer; and treating the first reactant material layer with a second reactant material to form a reacted material layer.

9. The method of claim 8 wherein the substrate is employed within a microelectronic product selected from the group consisting of integrated circuit products, ceramic substrate products and optoelectronic products.

10. The method of claim 8 wherein the wetting material is moisture.

11. The method of claim 8 wherein the wetting material is an alcohol.

12. The method of claim 8 wherein the substrate is treated with the wetting material through use of a minimum of one purge cycle within a reactor chamber within which is formed the reacted material layer upon the wettable substrate.

13. The method of claim 8 wherein the substrate is treated with the wetting material through use of a minimum of two purge cycles within a reactor chamber within which is formed the reacted material layer upon the wettable substrate.

14. The method of claim 8 wherein the reacted material layer is selected from the group consisting of conductor layers, semiconductor layers and dielectric layers.

15. A chemical vapor deposition method for forming a gate dielectric layer comprising:

providing a semiconductor substrate;

treating the semiconductor substrate with a wetting material to provide a wettable semiconductor substrate;

forming upon the wettable semiconductor substrate a first reactant material layer; and treating the first reactant material layer with a second reactant material to form a gate dielectric layer upon the wettable semiconductor substrate.

16. The method of claim 15 wherein the wetting material is moisture.

17. The method of claim 15 wherein the wetting material is an alcohol.

18. The method of claim 15 wherein the semiconductor substrate is treated with the wetting material through use of a minimum of one purge cycle within a reactor chamber within which is formed the gate dielectric layer upon the wettable semiconductor substrate.

19. The method of claim 15 wherein the semiconductor substrate is treated with the wetting material through use of a minimum of two purge cycles within a reactor chamber within which is formed the reacted material layer upon the wettable substrate.

20. The method of claim 15 wherein the gate dielectric layer is formed from a material selected from the group consisting of oxides and silicates of at least one of tantalum, aluminum, titanium, zirconium, yttrium, lanthanum and hafnium.

* * * * *